(12) United States Patent
Matsumoto et al.

(10) Patent No.: US 11,381,228 B2
(45) Date of Patent: Jul. 5, 2022

(54) SENSOR OUTPUT CIRCUIT

(71) Applicant: HITACHI AUTOMOTIVE SYSTEMS, LTD., Hitachinaka (JP)

(72) Inventors: Masahiro Matsumoto, Tokyo (JP); Hiroshi Nakano, Tokyo (JP); Akira Kotabe, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 122 days.

(21) Appl. No.: 16/760,430

(22) PCT Filed: Nov. 8, 2018

(86) PCT No.: PCT/JP2018/041424
§ 371 (c)(1),
(2) Date: Apr. 29, 2020

(87) PCT Pub. No.: WO2019/107102
PCT Pub. Date: Jun. 6, 2019

(65) Prior Publication Data
US 2021/0409012 A1 Dec. 30, 2021

(30) Foreign Application Priority Data

Nov. 30, 2017 (JP) .............................. JP2017-229802

(51) Int. Cl.
*G05F 3/26* (2006.01)
*H03K 5/1252* (2006.01)
(Continued)

(52) U.S. Cl.
CPC ............ *H03K 5/1252* (2013.01); *G05F 3/26* (2013.01); *H03K 17/16* (2013.01); *H03K 17/161* (2013.01);
(Continued)

(58) Field of Classification Search
CPC .... H03K 5/1252; H03K 17/102; H03K 17/16; H03K 17/161; H03K 19/00315; H03K 19/00361; G05F 3/26
See application file for complete search history.

(56) References Cited

U.S. PATENT DOCUMENTS

| 2007/0257724 | A1 | 11/2007 | Suzuki |
| 2011/0149456 | A1* | 6/2011 | Xiao ................ H03K 19/00315 361/91.5 |
| 2015/0056935 | A1 | 2/2015 | Komori et al. |

FOREIGN PATENT DOCUMENTS

| JP | S62-147815 A | 7/1987 |
| JP | H04-158629 A | 6/1992 |

(Continued)

OTHER PUBLICATIONS

English Translation of International Search Report, PCT/JP2018/041424 dated Feb. 26, 2019, 2 pgs.

*Primary Examiner* — Jung Kim
(74) *Attorney, Agent, or Firm* — Volpe Koenig

(57) ABSTRACT

A sensor output circuit is limited with high accuracy, and reduces radio wave radiation by signal transmission using a single-line signal. The sensor output includes a pulse signal Vin that changes according to a physical quantity to be measured, MOS transistors that perform on/off operations according to the pulse signal Vin, a constant current source that generates a constant current, a MOS transistor which generates a gate voltage of a MOS transistor, MOS transistors which form a current mirror circuit, and the MOS transistor which works to maintain a drain voltage of the MOS transistor at a constant voltage, and the output terminal which is driven by the MOS transistors connected in series. In addition, an output signal from the sensor output circuit (Continued)

is transmitted to a control circuit via an output signal line. The control circuit includes a pull-up resistor, a capacitor, and an input gate circuit.

11 Claims, 6 Drawing Sheets

(51) Int. Cl.
*H03K 19/003* (2006.01)
*H03K 17/16* (2006.01)

(52) U.S. Cl.
CPC . *H03K 19/00315* (2013.01); *H03K 19/00361* (2013.01)

(56) References Cited

FOREIGN PATENT DOCUMENTS

| | | | | |
|---|---|---|---|---|
| JP | H07-249975 A | 9/1995 | | |
| JP | 2005-236395 A | 9/2005 | | |
| JP | 2006-129331 A | 5/2006 | | |
| JP | 2006129331 A | * 5/2006 | ......... | H03K 19/0185 |
| JP | 2007-214605 A | 8/2007 | | |
| JP | 2007-306042 A | 11/2007 | | |
| JP | 2014-158184 A | 8/2014 | | |

\* cited by examiner

SENSOR OUTPUT CIRCUIT

TECHNICAL FIELD

The present invention relates to a sensor output circuit that outputs a pulse waveform to an output signal line (an output circuit of a sensor device), and more particularly to a sensor output circuit that can reduce radio wave radiation from the output signal line.

BACKGROUND ART

As an example of a method for reducing noise in an output circuit that outputs a pulse waveform to an output signal line, there is a technique described in PTL 1. In PTL 1, noise is reduced by converting the output current into a constant current and converting the output current into a differential signal.

CITATION LIST

Patent Literature

PTL 1: JP 7-249975 A

SUMMARY OF INVENTION

Technical Problem

In PTL 1, noise is reduced by converting an output current into a constant current and converting the output current into a differential signal. In addition, since PTL 1 intends signal transmission inside an LSI, it is possible to use a differential signal. The differential signal has an excellent effect on both noise effects and noise radiation. However, the output signal line is several meters or more like a sensor output circuit, and it is difficult to use a differential signal in an output circuit with strict cost restrictions, and signal transmission is performed by a single-line signal. For this reason, in the sensor output circuit, it is necessary to limit the output current with higher precision in order to suppress radio wave radiation. That is, in the above-described related art, consideration for limiting the output current with high accuracy is lacking.

The invention has been made in view of the above circumstances, and an object of the invention is to provide a sensor output circuit that reduces radio wave radiation even in signal transmission using the single-line signal.

Solution to Problem

In order to solve the above problem, in the invention, an output terminal for outputting a pulse signal is provided, a first MOS transistor and a second MOS transistor are connected to the output terminal in series, and the first MOS transistor is driven by a constant current, the second MOS transistor operates to maintain the drain terminal of the first MOS transistor at a constant voltage.

Advantageous Effects of Invention

According to this invention, it is possible to provide a sensor output circuit which reduces a radio wave radiation even in signal transmission using a single-line signal.

DESCRIPTION OF EMBODIMENTS

Hereinafter, embodiments of the invention will be described with reference to the accompanying drawings. Further, the embodiments can be combined as long as there is no contradiction.

First Embodiment

Figure 1:
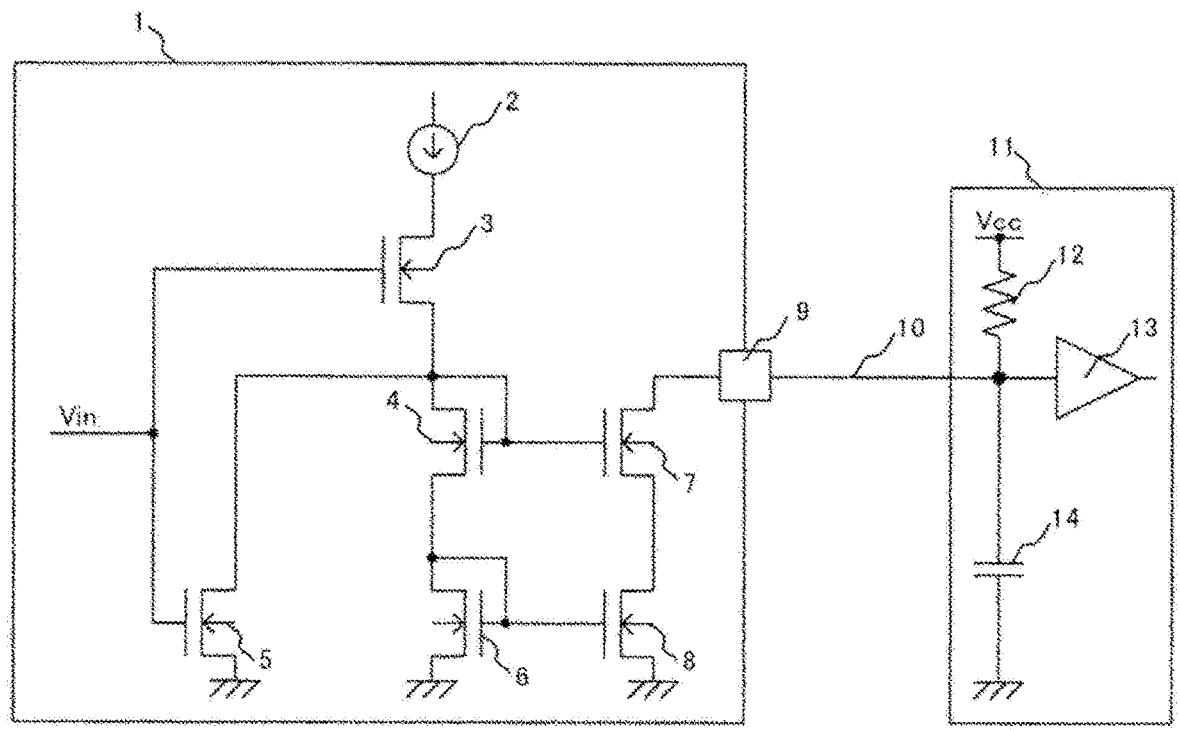
FIG. 1 is a diagram illustrating a configuration of a sensor output circuit according to a first embodiment.
Figure 3:
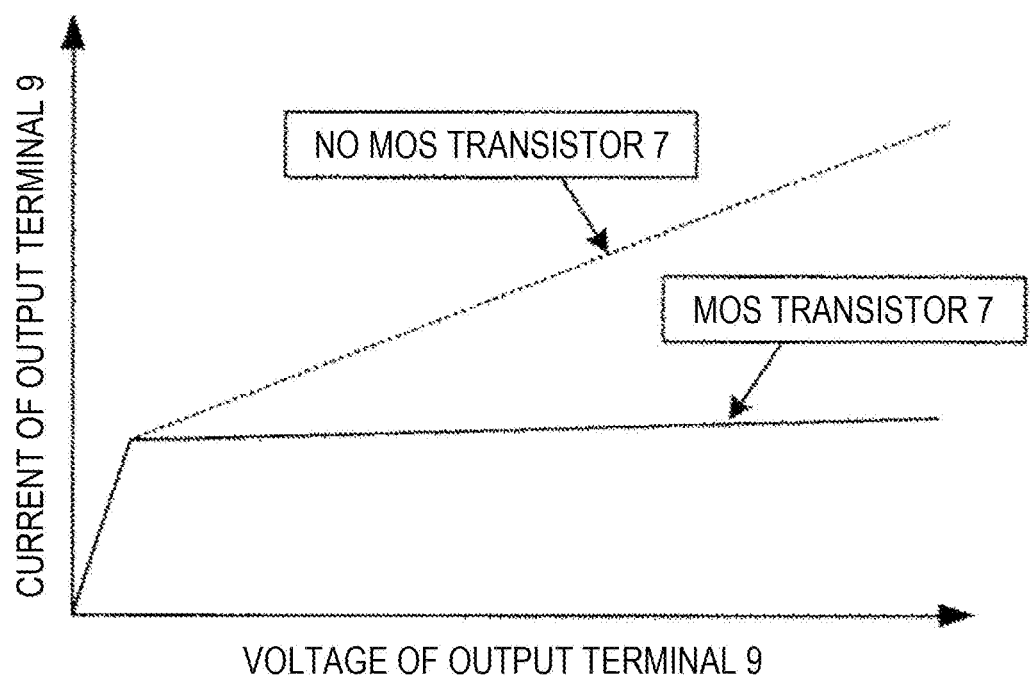
FIG. 3 is a graph illustrating voltage-current characteristics of an output terminal 9.
Figure 4:
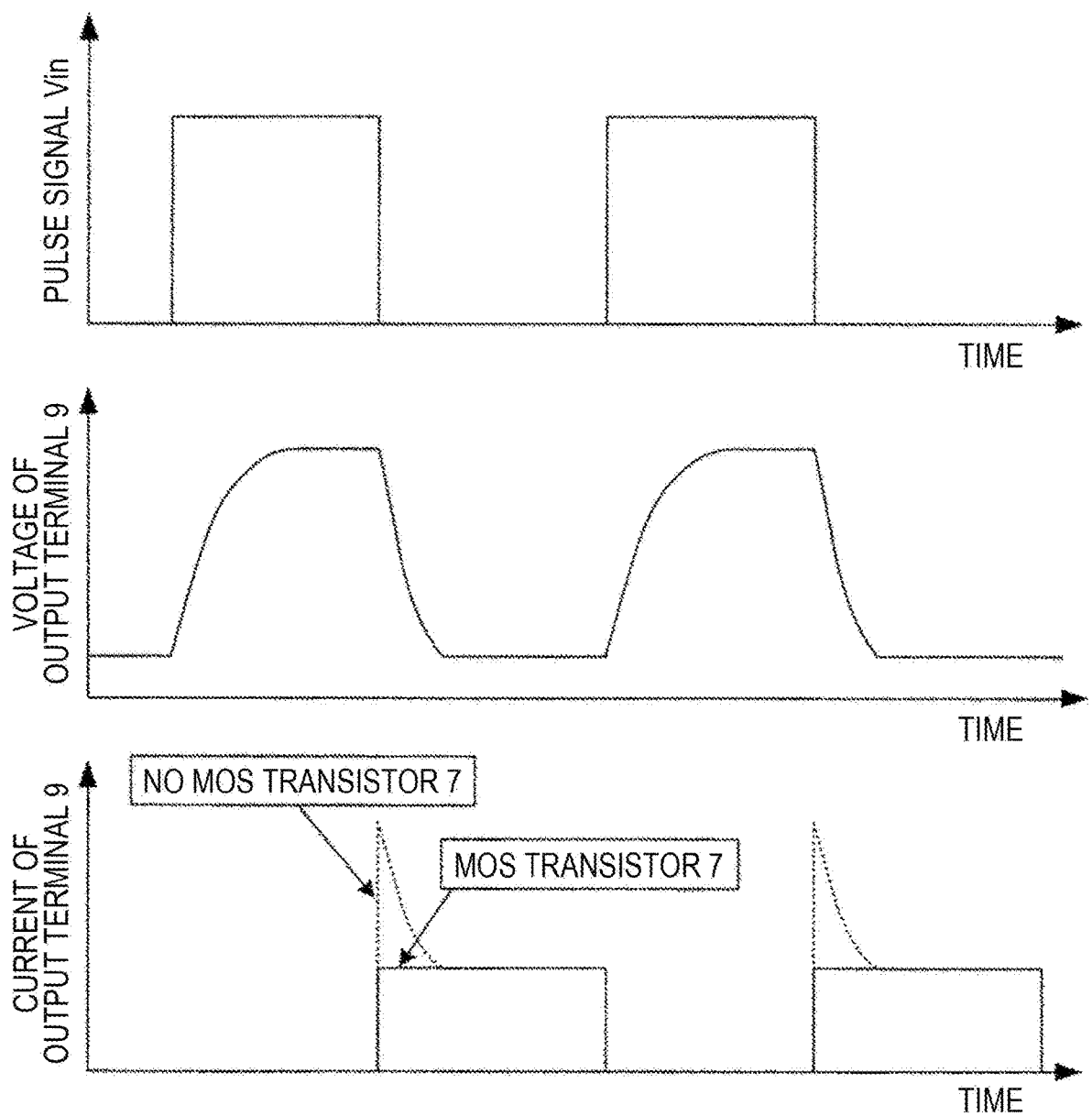
FIG. 4 is a diagram illustrating operation waveforms of the output terminal 9.

First, a sensor output circuit according to a first embodiment of the invention will be described with reference to FIGS. 1 to 4. Further, FIG. 1 illustrates the configuration of the sensor output circuit of the first embodiment, FIG. 2 illustrates the characteristics of a MOS transistor 8, FIG. 3 illustrates voltage-current characteristics of an output terminal 9, and FIG. 4 illustrates an operation waveform of the output terminal 9.

A sensor output circuit 1 of this embodiment includes a pulse signal Vin that changes according to a physical quantity to be measured, MOS transistors 3 and 5 that perform on/off operations according to the pulse signal Vin, a constant current source 2 that generates a constant current, a MOS transistor 4 which generates a gate voltage of a MOS transistor 7, MOS transistors 6 and 8 which form a current mirror circuit, and the MOS transistor 7 which works to maintain a drain voltage of the MOS transistor 8 at a constant voltage, and the output terminal 9 which is driven by the MOS transistors 7 and 8 connected in series. In addition, an output signal from the sensor output circuit 1 is transmitted to a control circuit 11 via an output signal line 10. The control circuit 11 includes a pull-up resistor 12, a capacitor 14, and an input gate circuit 13.

Figure 2:
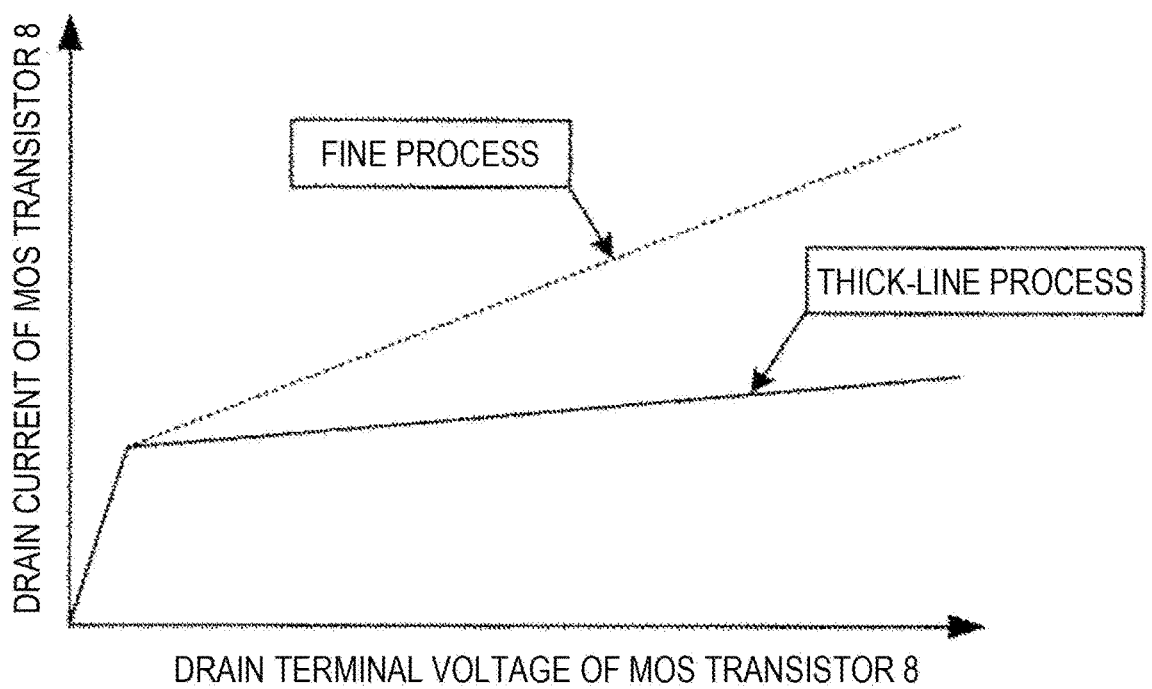
FIG. 2 is a graph illustrating characteristics of a MOS transistor 8.

Here, the characteristics of the MOS transistor 8 are basically driven by a constant current as illustrated in FIG. 2, but the drain current increases as the drain terminal voltage increases.

In particular, as the process becomes finer, the amount of increase in the drain current increases. In recent years, even in a circuit mainly configured by an analog circuit such as a sensor output circuit, the miniaturization of a sensor signal processing unit integrated on the same chip has been advanced. This characteristic of the increasing drain current causes radio wave radiation to increase as described later.

Therefore, in this embodiment, the MOS transistor 7 is disposed between the output terminal and the MOS transistor 8 so that the drain voltage of the MOS transistor 8 becomes constant. The gate voltage of the MOS transistor 7 is determined by the current value of the constant current source 2 and the diode-connected MOS transistors 4 and 6, and is kept substantially constant. The source voltage of the MOS transistor 7 (the drain voltage of the MOS transistor 8) is kept lower than the gate voltage of the MOS transistor 7 by a threshold value of the MOS transistor 7. As a result, as illustrated in FIG. 3, the increase in the current at the output terminal 9 due to the increase in the voltage at the output terminal 9 can be reduced to 1/10 or less.

Next, the operation of the sensor output circuit 1 will be described with reference to FIG. 4. When the pulse signal Vin is at a high level, the MOS transistor 3 is turned off, and the MOS transistor 5 is turned on. As a result, the gate voltages of the MOS transistors 7 and 8 become 0 V, so that the MOS transistors 7 and 8 are turned off, and the voltage of the output terminal 9 becomes the high level by the pull-up resistor 12. Next, when the pulse signal Vin is at a low level, the MOS transistor 3 is turned on, and the MOS transistor 5 is turned off, so that the current from the constant current source 2 flows through the MOS transistors 4 and 6. As a result, a current proportional to the drain current of the MOS transistor 6, which is the source side of the current mirror circuit configured by the MOS transistors 6 and 8, flows to the drain of the MOS transistor 8, and is driven at a constant current. Here, as illustrated in FIG. 2, the drain current tends to increase as the drain voltage increases. Since the MOS transistor 7 in this embodiment operates in the saturation region, it works to make the drain voltage of the MOS transistor 8 constant, and a constant current flows through the output terminal 9 as illustrated in FIG. 3. Since this current flows through the pull-up resistor 12, the voltage of the output terminal becomes the low level.

At this time, when the MOS transistor 7 is not provided, a large whisker-like current flowing to the output terminal 9 is generated as illustrated in FIG. 4, but when the MOS transistor 7 is provided, no whisker-like current is generated. The whisker-like current illustrated in FIG. 4 is generated when the voltage and current characteristics of the output terminal 9 illustrated in FIG. 3 have a gradient. By adding the MOS transistor 7 as in this embodiment, this characteristic can be improved, so that a whisker-like current can be suppressed. In addition, since the whisker-like current illustrated in FIG. 4 has many radio-frequency components, when this current flows through the output signal line 10, radio wave radiation occurs. However, according to this embodiment, the whisker-like current can be eliminated, so that the radiation of radio waves from the output signal line 10 can be reduced.

In addition, in this embodiment, a breakdown voltage of the output terminal 9 can be improved by adding the MOS transistor 7. In the sensor output circuit 1, it is necessary to prevent the sensor output circuit 1 from being destroyed even if static electricity or overvoltage is applied to the output terminal 9, and it is necessary to improve the breakdown voltage of the output terminal 9.

Hereinafter, the reason why the breakdown voltage of the output terminal 9 is improved in this embodiment will be described. First, in a case where the pulse signal Vin is at a high level and the MOS transistors 7 and 8 are turned off, the breakdown voltage of the output terminal 9 is the sum of the source=drain breakdown voltages of the MOS transistors 7 and 8. That is, by adding the MOS transistor 7, the breakdown voltage of the output terminal 9 can be improved by an amount corresponding to the source=drain breakdown voltage of the MOS transistor 7.

Next, in a case where the pulse signal Vin is at a low level and the MOS transistors 7 and 8 are turned on, the breakdown voltage of the output terminal 9 is determined by the product of the current flowing through the output terminal 9 and the voltage of the output terminal 9. Therefore, in this embodiment in which the current at the output terminal 9 can be kept constant regardless of the voltage at the output terminal 9, breakdown can be prevented up to a higher voltage. That is, a higher breakdown voltage can be obtained.

Next, the application of a high breakdown voltage MOS transistor to the first embodiment will be described.

The high breakdown voltage MOS transistor that can be used in the fine process has a drain voltage dependency of the drain current worse than the characteristics of the MOS transistor in the fine process illustrated in FIG. 2. Therefore, it is useful to change only the MOS transistor 7 to a high breakdown voltage MOS transistor. First, since the breakdown voltage of the output terminal 9 is determined by the sum of the breakdown voltages of the MOS transistor 7 and the MOS transistor 8, a higher breakdown voltage can be obtained by replacing at least the MOS transistor 7 with a high breakdown voltage MOS transistor.

Next, a driving method will be described in the first embodiment. The circuit configuration of this embodiment can be regarded as a current mirror circuit configured by the MOS transistors 4, 6, 7, and 8. The current on the source side of this current mirror circuit is controlled by using the MOS transistors 3 and 5. By controlling the current on the source side of the current mirror circuit in this manner, the amplitude of the voltage for driving the gate of the MOS transistor 7 can be reduced. The signal for driving the gate of the MOS transistor 7 leaks to the output terminal 9 via the capacitance between the gate and the drain of the MOS transistor 7, and causes radio wave radiation from the output signal line 10. That is, by controlling the current on the source side of the current mirror circuit configured by the MOS transistors 4, 6, 7, and 8 using the MOS transistors 3 and 5, the current between the gate and the drain of the MOS transistor 7 is controlled. Radio waves that leak to the output terminal 9 and are radiated from the output signal line 10 can be reduced.

Second Embodiment

A second embodiment of the invention will be described. The description of the same correspondence as in the first embodiment will be omitted.

In this embodiment, the MOS transistor 8 is a low breakdown voltage MOS transistor, and the MOS transistor 7 is a high breakdown voltage MOS transistor. Since the drain voltage dependency of the drain current of the MOS transistor 8 can be reduced, and the drain voltage of the MOS transistor 8 can be kept constant by the MOS transistor 7, the dependency of the current of the output terminal 9 on the voltage of the output terminal 9 is good.

This is because the drain voltage dependency of the drain current of the MOS transistor is better in the low breakdown voltage MOS than in the high breakdown voltage MOS transistor, and the effect of the MOS transistor 7 that keeps the drain voltage of the MOS transistor 8 constant is not different in between a high breakdown voltage MOS transistor and the low breakdown voltage MOS transistor. In addition, as for the chip size, the size of the high breakdown voltage MOS transistor for flowing the same drain current is larger than the size required for the low breakdown voltage MOS transistor. For this reason, it is possible to reduce the chip size by using the MOS transistor 7 as a high breakdown voltage MOS transistor and the MOS transistor 8 as a low breakdown voltage MOS transistor. In other words, the breakdown voltage of the output terminal 9 can be improved by increasing the breakdown voltage between the drain and source of the MOS transistor 7 compared to the breakdown voltage between the drain and source of the MOS transistor 8, the dependence of the voltage of the output terminal 9 on the current of the output terminal 9 can be improved, and the chip size can be reduced.

Third Embodiment

Figure 5:
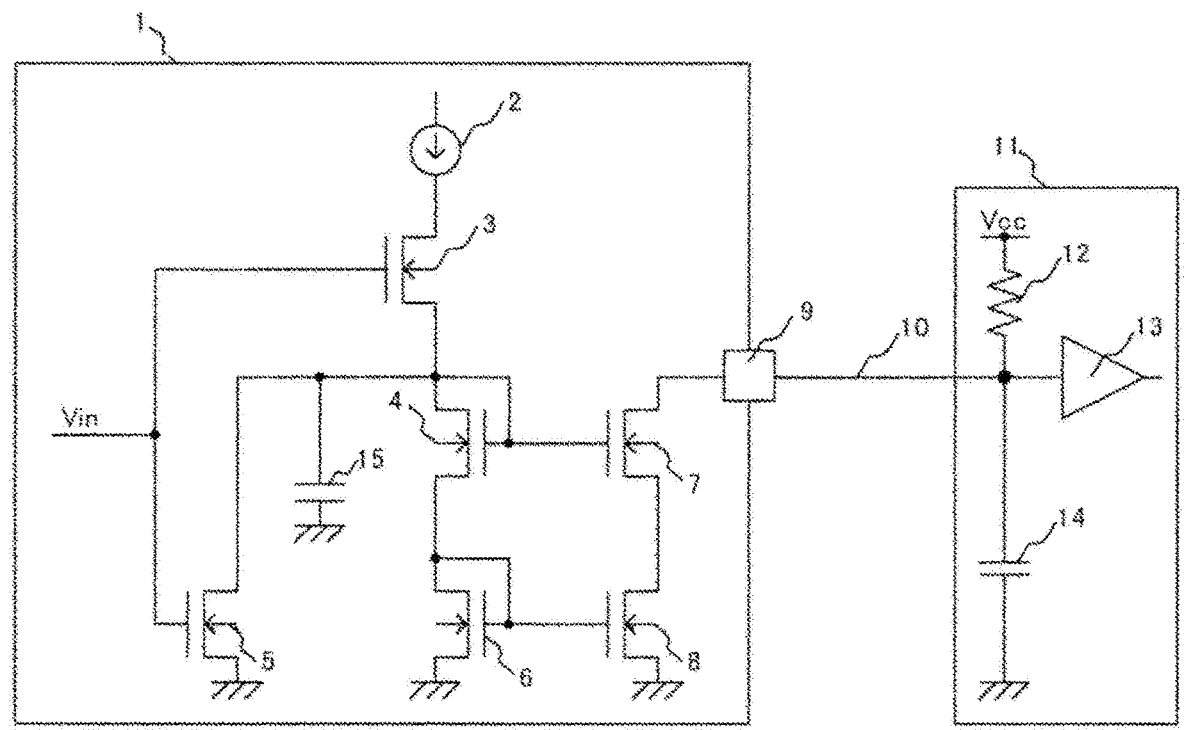
FIG. 5 is a diagram illustrating a configuration of a sensor output circuit according to a third embodiment.
Figure 6:
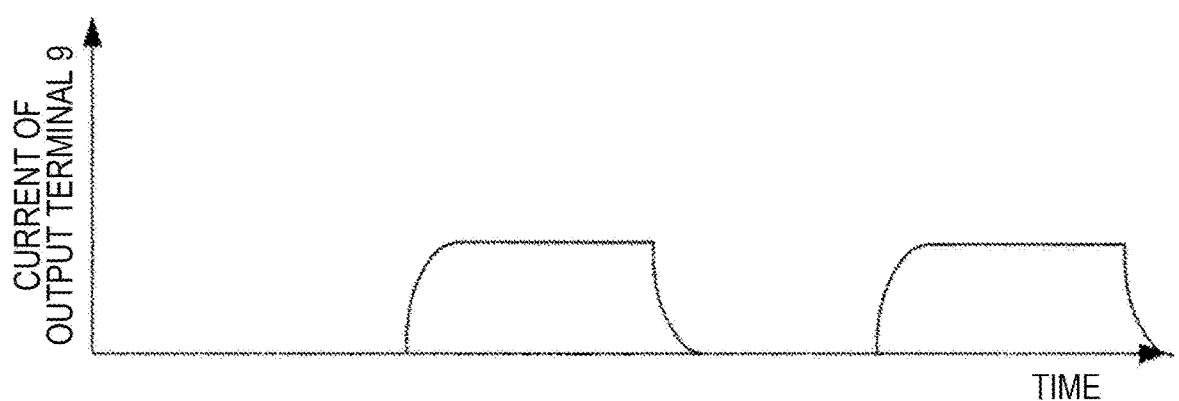
FIG. 6 is a diagram illustrating a current waveform at the output terminal 9 in the third embodiment.

Next, a sensor output circuit according to a third embodiment of the invention will be described with reference to FIGS. 5 and 6. Further, FIG. 5 illustrates the configuration of the sensor output circuit of the second embodiment, and FIG. 6 illustrates the current waveform of the output terminal 9.

A sensor output circuit 1 of this embodiment is basically the same as the sensor output circuit 1 of the first embodiment, except that a capacitor 15 is added. The addition of the capacitor 15 makes the change in the gate voltage of the MOS transistors 7 and 8 gentle. This is because the capacitor 15 is charged by the constant current source 2, and the change speed of the current flowing through the MOS transistors 4 and 6 is reduced by the capacitance value of the capacitor 15 and the current of the constant current source 2. As a result, as illustrated in FIG. 6, the current change of the output terminal 9 becomes gentle. Then, by making the current change of the output terminal 9 gentle, the harmonic component of the current waveform illustrated in FIG. 9 can be reduced, so that the radio wave radiation from the output signal line 10 can be reduced.

Fourth Embodiment

Figure 7:
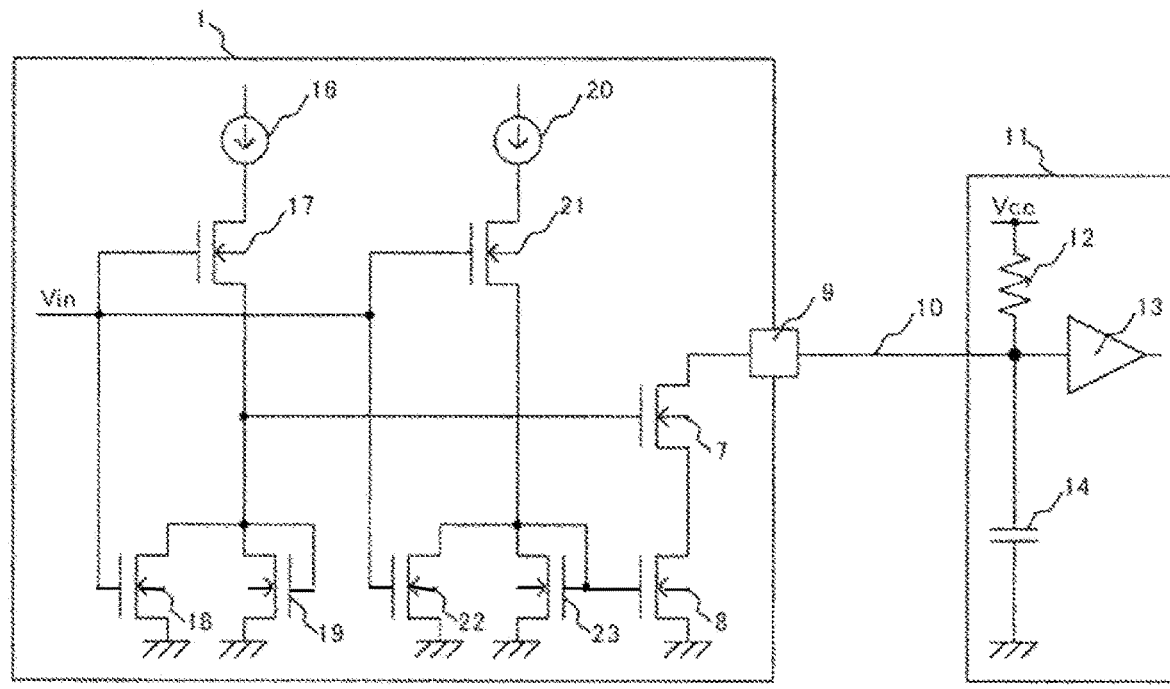
FIG. 7 is a diagram illustrating a configuration of a sensor output circuit according to a fourth embodiment.

Next, a sensor output circuit according to a fourth embodiment of the invention will be described with reference to FIG. 7. Further, FIG. 7 illustrates the configuration of the sensor output circuit of the fourth embodiment.

A sensor output circuit 1 of this embodiment is basically the same as the sensor output circuit 1 of the first embodiment, except that the drive circuits for the MOS transistor 7 and the MOS transistor 8 are separately provided. The drive circuit of the MOS transistor 7 includes MOS transistors 17 and 18 that perform on/off operations in response to the pulse signal Vin, a constant current source 16 that generates a constant current, and a MOS transistor 19 that generates a gate voltage of the MOS transistor 7. The drive circuit of the MOS transistor 8 includes MOS transistors 21 and 22 that perform on/off operations in response to the pulse signal Vin, a constant current source 20 that generates a constant current, and a MOS transistor 23 that forms a current mirror circuit with the MOS transistor 8.

The configuration of the third embodiment allows the gate voltage of the MOS transistor 7 to be lower than that of the first embodiment. For this reason, the low level of the output terminal 9 can be made to be a lower voltage.

Fifth Embodiment

Figure 8:
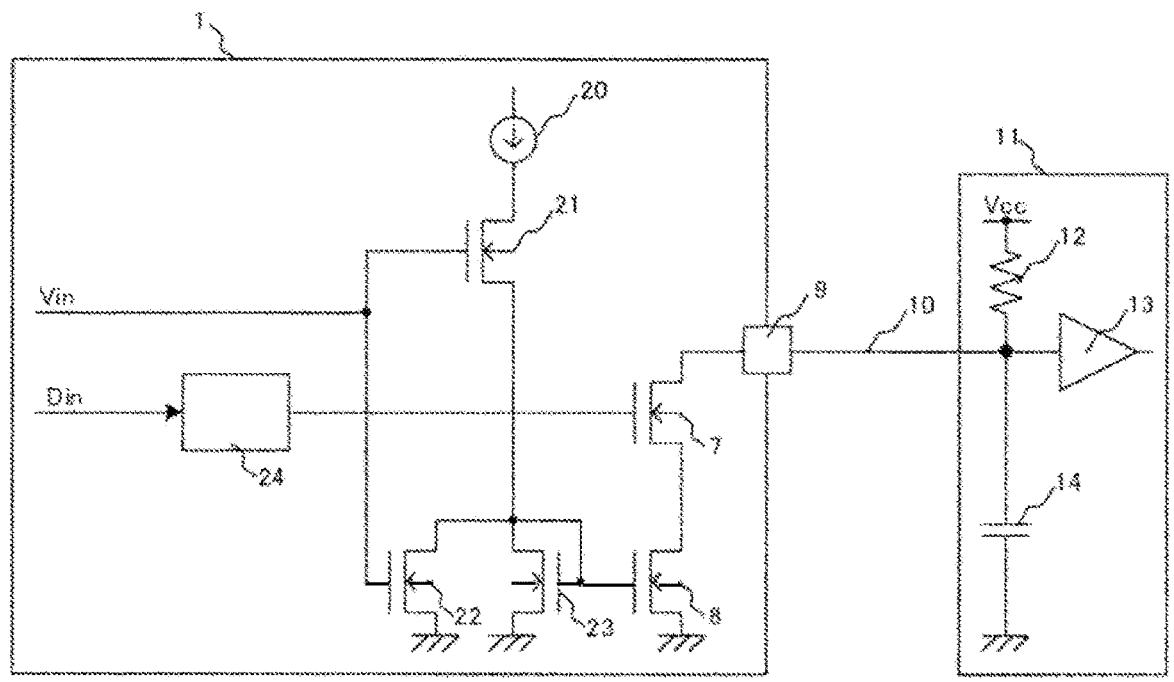
FIG. 8 is a diagram illustrating a configuration of a sensor output circuit according to a fifth embodiment.

Next, a sensor output circuit according to a fifth embodiment of the invention will be described with reference to FIGS. 8 and 9. Further, FIG. 8 illustrates the configuration of the sensor output circuit of the fifth embodiment, and FIG. 9 illustrates the voltage waveform of the output terminal 9.

A sensor output circuit 1 of this embodiment is basically the same as the sensor output circuit 1 of the fourth embodiment, except that the drive circuit of the MOS transistor 7 is changed to a DA converter 24, and the output voltage of the DA converter 24 is controlled by the signal Din to control the gate voltage of the MOS transistor 7. In the configuration of the third embodiment, since the gate voltage of the MOS transistor 7 can be controlled, the low level of the output terminal 9 can be controlled. As a result, as illustrated in FIG. 9, a low-level signal of the output signal is changed so that a low-amplitude waveform can be superimposed.

Figure 9:
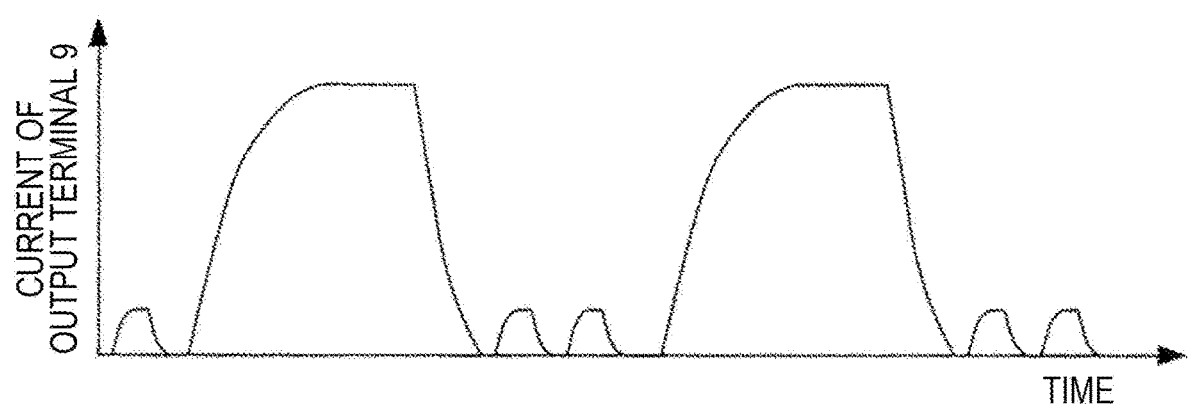
FIG. 9 is a diagram illustrating a voltage waveform at the output terminal 9 in the fifth embodiment.

In a case where a voltage waveform as illustrated in FIG. 9 is applied to a single-line signal line, radio waves corresponding to the current of the single-line signal are emitted for radio-frequency signals, but radio waves corresponding to the voltage are emitted for low-frequency signals. The frequency component of this low-frequency radio wave radiation substantially matches the frequency component of the voltage waveform illustrated in FIG. 4. Here, in order to cancel harmonic components of the voltage waveform illustrated in FIG. 4, a waveform having a small amplitude has been superimposed on the low level as illustrated in FIG. 9. That is, by superimposing a waveform having a small amplitude on the low level of the output terminal 9, it is possible to reduce the radio wave radiation of the harmonic component of the voltage waveform illustrated in FIG. 4.

REFERENCE SIGNS LIST 1 sensor output circuit
2 constant current source
3 MOS transistor
4 MOS transistor
5 MOS transistor
6 MOS transistor
7 MOS transistor
8 MOS transistor
9 output terminal
10 output signal line
11 control circuit
12 pull-up resistor
13 input gate circuit
14 capacitor
15 capacitor
16 constant current source
17 MOS transistor
18 MOS transistor
19 MOS transistor
20 constant current source
21 MOS transistor
22 MOS transistor
23 MOS transistor
24 DA converter

The invention claimed is:

1. A sensor output circuit having an output terminal that outputs a pulse signal, comprising:
   a first MOS transistor that is driven by a constant current; and
   a second MOS transistor that is provided between the first MOS transistor and the output terminal,
   wherein a source terminal of the second MOS transistor is connected to a drain terminal of the first MOS transistor,
   a drain terminal of the second MOS transistor is connected to the output terminal,
   a breakdown voltage between a drain and a source of the second MOS transistor is higher than a breakdown voltage between a drain and a source of the first MOS transistor, and
   a capacitor is disposed on at least one of a gate terminal of the first MOS transistor and a gate terminal of the second MOS transistor.

2. The sensor output circuit according to claim 1, wherein a gate voltage of the second MOS transistor is kept constant, so that a voltage of a drain terminal of the first MOS transistor is kept a constant voltage.

3. The sensor output circuit according to claim 1, wherein the first MOS transistor is a part of a MOS transistor forming a current mirror circuit.

4. The sensor output circuit according to claim 3, wherein a switch circuit that controls a current on a source side exists between the source side of the current mirror circuit and a constant current source.

5. The sensor output circuit according to claim 4, further comprising:
a second current mirror circuit that includes the second MOS transistor as a component,
wherein a switch circuit for controlling a current of the second current mirror circuit exists between a source side of the second current mirror circuit and a second constant current source.

6. The sensor output circuit according to claim 4, wherein a digital to analog (DA) converter is connected to a gate terminal of the second MOS transistor.

7. The sensor output circuit according to claim 6, wherein a waveform having a small amplitude is superimposed on a low level of the output terminal.

8. A sensor device, comprising:
the sensor output circuit according to claim 1.

9. A sensor output circuit having an output terminal that outputs a pulse signal, comprising:
a first MOS transistor that is driven by a constant current;
a second MOS transistor that is provided between the first MOS transistor and the output terminal; and
a second current mirror circuit that includes the second MOS transistor as a component,
wherein a source terminal of the second MOS transistor is connected to a drain terminal of the first MOS transistor,
a drain terminal of the second MOS transistor is connected to the output terminal,
a breakdown voltage between a drain and a source of the second MOS transistor is higher than a breakdown voltage between a drain and a source of the first MOS transistor,
the first MOS transistor is a part of a MOS transistor forming a current mirror circuit,
a switch circuit that controls a current on a source side exists between the source side of the current mirror circuit and a constant current source, and
a switch circuit for controlling a current of the second current mirror circuit exists between a source side of the second current mirror circuit and a second constant current source.

10. A sensor output circuit having an output terminal that outputs a pulse signal, comprising:
a first MOS transistor that is driven by a constant current; and
a second MOS transistor that is provided between the first MOS transistor and the output terminal,
wherein a source terminal of the second MOS transistor is connected to a drain terminal of the first MOS transistor,
a drain terminal of the second MOS transistor is connected to the output terminal,
a breakdown voltage between a drain and a source of the second MOS transistor is higher than a breakdown voltage between a drain and a source of the first MOS transistor,
the first MOS transistor is a part of a MOS transistor forming a current mirror circuit,
a switch circuit that controls a current on a source side exists between the source side of the current mirror circuit and a constant current source, and
a digital to analog (DA) converter is connected to a gate terminal of the second MOS transistor.

11. The sensor output circuit according to claim 10, wherein a waveform having a small amplitude is superimposed on a low level of the output terminal.

* * * * *